US009231090B2

(12) United States Patent
Higuchi et al.

(10) Patent No.: US 9,231,090 B2
(45) Date of Patent: Jan. 5, 2016

(54) TRENCH-GATE-TYPE INSULATED GATE BIPOLAR TRANSISTOR

(71) Applicant: DENSO CORPORATION, Kariya, Aichi-pref. (JP)

(72) Inventors: Yasushi Higuchi, Okazaki (JP); Masakiyo Sumitomo, Okazaki (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 14/375,895

(22) PCT Filed: Feb. 18, 2013

(86) PCT No.: PCT/JP2013/000866
§ 371 (c)(1),
(2) Date: Jul. 31, 2014

(87) PCT Pub. No.: WO2013/128833
PCT Pub. Date: Sep. 6, 2013

(65) Prior Publication Data
US 2014/0339602 A1  Nov. 20, 2014

(30) Foreign Application Priority Data

Mar. 2, 2012  (JP) .................................. 2012-46618

(51) Int. Cl.
*H01L 29/739* (2006.01)
*H01L 29/08* (2006.01)
(Continued)

(52) U.S. Cl.
CPC ........ *H01L 29/7393* (2013.01); *H01L 29/0808* (2013.01); *H01L 29/1008* (2013.01);
(Continued)

(58) Field of Classification Search
CPC ............ H01L 29/7397; H01L 29/1095; H01L 29/1008; H01L 29/0808
See application file for complete search history.

(56) References Cited

U.S. PATENT DOCUMENTS

| 5,329,142 A | 7/1994 | Kitagawa et al. |
| 5,796,125 A | 8/1998 | Matsudai et al. |

(Continued)

FOREIGN PATENT DOCUMENTS

| JP | 2003-282870 A | 10/2003 |
| JP | 2004-006778 A | 1/2004 |
| JP | 2005-191327 A | 7/2005 |

OTHER PUBLICATIONS

International Search Report of the International Searching Authority mailed Mar. 26, 2013 for the corresponding international application No. PCT/JP2013/000866 (and English translation).

(Continued)

*Primary Examiner* — Ida M Soward
(74) *Attorney, Agent, or Firm* — Posz Law Group, PLC

(57) ABSTRACT

In a trench-gate-type insulated gate bipolar transistor, a current will not flow down to a lower portion of a trench, a high electrical field at the lower portion of the trench is suppressed even if a high voltage is applied, such as at a time of turning off, an increase in on-state resistance and a decrease in breakdown resistance and withstand voltage are suppressed. In the semiconductor device, a plurality of trenches is disposed to reach a rear surface of a drift layer, and a collector layer is disposed at a tip end side in an extended direction of the trenches in a surface layer portion of the drift layer. When a gate electrode is applied with a predetermined voltage, a channel region is formed in a portion of the base layer contacting the trenches, and an electric current flows in the predetermined direction along the trenches.

5 Claims, 4 Drawing Sheets

(51) Int. Cl.
*H01L 29/10* (2006.01)
*H01L 29/423* (2006.01)

(52) U.S. Cl.
CPC ........ *H01L29/1095* (2013.01); *H01L 29/4236* (2013.01); *H01L 29/7394* (2013.01); *H01L 29/7397* (2013.01)

(56) References Cited

U.S. PATENT DOCUMENTS

| | | | | |
|---|---|---|---|---|
| 5,828,100 | A * | 10/1998 | Tamba et al. | 257/328 |
| 6,469,344 | B2 * | 10/2002 | Iwamuro et al. | 257/330 |
| 6,696,323 | B2 * | 2/2004 | Yamaguchi et al. | 438/138 |
| 6,774,408 | B2 * | 8/2004 | Ninomiya | 257/136 |
| 7,056,779 | B2 * | 6/2006 | Hattori | 438/197 |
| 7,095,079 | B2 * | 8/2006 | Okuno et al. | 257/331 |
| 7,615,846 | B2 * | 11/2009 | Harada | 257/579 |
| 8,178,947 | B2 * | 5/2012 | Takahashi et al. | 257/565 |
| 8,304,814 | B2 * | 11/2012 | Bauer | 257/205 |
| 8,405,122 | B2 * | 3/2013 | Kouno et al. | 257/139 |
| 8,421,184 | B2 * | 4/2013 | Koyama et al. | 257/512 |
| 8,502,345 | B2 * | 8/2013 | Nemoto et al. | 257/565 |
| 8,598,622 | B2 * | 12/2013 | Sadamatsu et al. | 257/139 |
| 8,659,065 | B2 * | 2/2014 | Sumitomo et al. | 257/302 |
| 9,041,051 | B2 * | 5/2015 | Chen et al. | 257/139 |
| 2004/0119091 | A1 | 6/2004 | Suzuki et al. | |
| 2005/0001265 | A1 | 1/2005 | Shiraki et al. | |
| 2005/0230747 | A1 | 10/2005 | Suzuki et al. | |
| 2006/0163649 | A1 * | 7/2006 | Otsuki | 257/330 |
| 2007/0210350 | A1 * | 9/2007 | Omura et al. | 257/287 |
| 2007/0252195 | A1 * | 11/2007 | Yoshikawa et al. | 257/329 |
| 2008/0293202 | A1 | 11/2008 | Shiraki et al. | |
| 2008/0308839 | A1 * | 12/2008 | Okada | 257/133 |
| 2009/0179260 | A1 * | 7/2009 | Kobayashi | 257/330 |
| 2010/0230716 | A1 * | 9/2010 | Naijo | 257/139 |
| 2012/0025874 | A1 * | 2/2012 | Saikaku et al. | 327/109 |
| 2012/0056241 | A1 | 3/2012 | Sumitomo et al. | |
| 2012/0074459 | A1 * | 3/2012 | Ogura | 257/139 |
| 2012/0104555 | A1 * | 5/2012 | Bobde et al. | 257/587 |
| 2012/0146091 | A1 * | 6/2012 | Tanabe et al. | 257/139 |
| 2013/0334566 | A1 * | 12/2013 | Rahimo et al. | 257/139 |

OTHER PUBLICATIONS

Written Opinion of the International Searching Authority mailed Mar. 26, 2013 for the corresponding international application No. PCT/JP2013/000866 (and English translation).

Office Action mailed May 20, 2014 issued in the corresponding JP patent application No. 2012-046618 (and English translation).

* cited by examiner

TRENCH-GATE-TYPE INSULATED GATE BIPOLAR TRANSISTOR

CROSS REFERENCE TO RELATED APPLICATIONS

The present disclosure is a U.S. national stage application of International Patent Application No. PCT/JP2013/000866 filed on Feb. 18, 2013 and is based on Japanese Patent Application No. 2012-46618 filed on Mar. 2, 2012, the contents of which are incorporated herein by reference.

TECHNICAL FIELD

The present disclosure relates to a lateral-type semiconductor device that is formed with a trench-gate-type insulated gate bipolar transistor (hereinafter, simply referred to as IGBT) and allows an electric current to flow in a planar direction of a substrate.

BACKGROUND

Conventionally, a lateral-type semiconductor device in which a trench-gate-type IGBT is formed and an electric current flows in a planar direction of a substrate has been proposed, for example, in a patent literature 1. In this semiconductor device, in particular, a P-type base layer is formed in a surface layer portion of an N⁻-type drift layer, and an N⁺-type emitter layer is formed in a surface layer portion of the base layer. Further, a plurality of trenches each of which passes through the base layer and the emitter layer and reaches the drift layer are extended in one direction. A gate insulation film and a gate electrode are orderly formed on a wall surface of each trench. It is to be noted that this trench does not reach a rear surface of the drift layer.

An emitter electrode is provided on the base layer and the emitter layer through an interlayer insulation film. The emitter electrode is electrically connected to the base layer and the emitter layer through contact holes formed in the interlayer insulation film. A P⁺-type collector layer is formed in the surface layer portion of the drift layer at a position separated from the base layer. Specifically, this collector layer is disposed in the drift layer adjacent to a side wall of the trench. Namely, a distance between the side wall of each trench and the collector layer is different. Further, a collector electrode is provided on the collector layer.

In such a semiconductor device, when a predetermined gate voltage is applied to the gate electrode, an N-type channel region is formed in the base layer at a portion adjoining the trench. When electrons are supplied from the emitter layer to the drift layer through the channel region and holes are supplied from the collector layer to the drift layer, a resistance value falls due to conductivity modulation and thus the semiconductor device becomes in an on state.

PRIOR ART LITERATURE

Patent Literature

Patent Literature 1: JP 09-74197 A

In the semiconductor device described above, however, after the flowing in the drift layer in a planar direction, the current flows along the side wall of the trench 6 by being bent in a direction perpendicular to a planar direction of the drift layer under the trench. Therefore, a current concentration easily occurs at the lower portion of the trench. As a result, an on-state resistance is likely to increase, and breakdown resistance is likely to reduce. In particular, the current concentration easily occurs at the lower portion of the trench that is the nearest to the collector layer.

When a high voltage is applied, such as at a time of turning off, a high electrical field is generated at the lower portion of the trench. Further, a withstand voltage reduces, and the breakdown resistance reduces.

SUMMARY

The present disclosure is made in view of the foregoing issues, and it is an object of the present disclosure to provide a semiconductor device, which is capable of suppressing an increase in on-state resistance and a decrease in breakdown resistance, and is capable of suppressing a further decrease in withstand voltage.

According to an aspect of the present disclosure, a semiconductor device includes a semiconductor layer providing a first conductivity-type drift layer, a second conductivity-type base layer disposed at least in a surface layer portion of the drift layer adjacent to a front surface of the drift layer, a plurality of trenches extended in a predetermined direction from the base layer to the drift layer, a gate insulation film disposed in a wall surface of each of the plurality of trenches, a gate electrode disposed on the gate insulation film, a first conductivity-type emitter layer disposed in a surface layer portion of the base layer and at a side portion of each of the plurality of trenches, a second conductivity-type collector layer disposed in the surface layer portion of the drift layer and separated from the base layer, an emitter electrode electrically connected to the emitter layer and the base layer, and a collector electrode electrically connected to the collector layer. In the semiconductor device, further, the plurality of trenches reaches a rear surface of the drift layer, and the collector layer is disposed at a tip end side in an extended direction of the trenches in the surface layer portion of the drift layer. When a predetermined voltage is applied to the gate electrode, a channel region is formed at a portion of the base layer contacting the trenches, and thus an electric current flows in the extended direction of the trenches along the trenches.

According to the semiconductor device described above, the trench is formed to reach the rear surface of the drift layer, and the current flows in the extended direction of the trench along the trench. Namely, the current does not flow down to the lower portion of the trench. Therefore, a current concentration will not occur in the lower portion of the trench. As such, an increase in on-state resistance and a decrease in breakdown resistance are suppressed. Further, since the trench is formed to reach the rear surface of the drift layer, even if a high voltage is applied, such as at a time of turning off, an occurrence of a high electrical field at the lower portion of the trench can be suppressed. As such, the decrease in withstand voltage and the decrease in breakdown resistance can be suppressed.

BRIEF DESCRIPTION OF DRAWINGS

The above and other objects, features and advantages of the present disclosure will become more apparent from the following detailed description made with reference to the accompanying drawings, in which like parts are designated by like reference numbers and in which.

EMBODIMENTS FOR CARRYING OUT INVENTION

Figure 1:
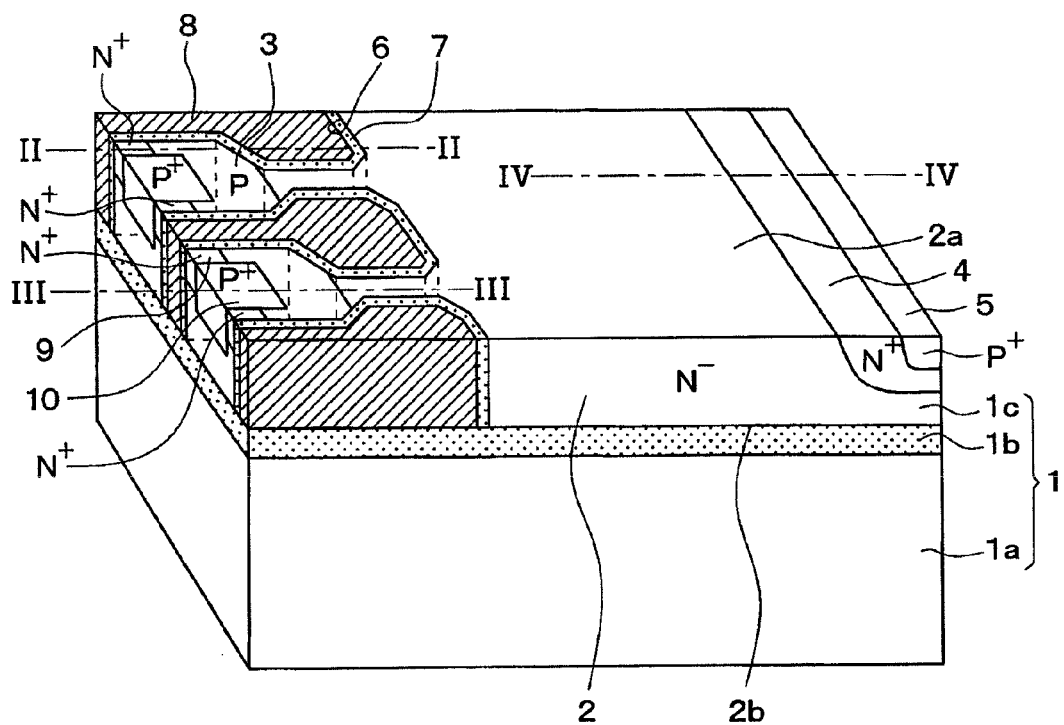
FIG. 1 is a perspective cross-sectional view of a semiconductor device according to a first embodiment of the present disclosure.

Hereinafter, embodiments of the present disclosure will be described with reference to the drawings. In the following descriptions of the embodiments, the same or equivalent parts are designated with the same reference numbers.

First Embodiment

A first embodiment of the present disclosure will be described with reference to the drawings. As shown in FIGS. 1 to 4, a semiconductor device is constructed by using a semiconductor substrate 1 in which an insulation film 1b is formed on a support substrate 1a, a semiconductor layer 1c is formed on the insulation film 1b, and the support substrate 1a and the semiconductor layer 1c are separated from each other by the insulation film 1b. That is, in the present embodiment, an SOI substrate is used as the semiconductor substrate 1. The semiconductor layer 1c is configured to serve as an $N^-$-type drift layer. Components forming a lateral-type IGBT is formed on a surface layer portion of this drift layer 2.

In the present embodiment, the insulation film 1b corresponds to a separation film. As the support substrate 1a, for example, a silicon substrate is used, but a ceramic substrate or the like may also be used.

In the drift layer 2, a P-type base layer 3 is formed in the surface layer portion adjacent to a front surface 2a. In the present embodiment, this base layer 3 is formed to extend in one direction and to reach a rear surface 2b of the drift layer 2 (semiconductor layer 1c) from the front surface 2a.

The front surface 2a of the drift layer 2 is a front surface of the semiconductor layer 1c, and is a surface of the semiconductor layer 1c opposite to the insulation film 1b. The rear surface 2b of the drift layer 2 is a rear surface of the semiconductor layer 1c, and is a surface of the semiconductor layer 1c adjacent to the insulation film 1b. That is, the base layer 3 is formed to reach the insulation film 1b.

An $N^+$-type buffer layer 4 is formed in the surface layer portion of the drift layer 2 at a position separate from the base layer 3. The buffer layer 4 is formed to be parallel to an extended direction of the base layer 3. Although this buffer layer 4 is not always necessary, the buffer layer 4 is provided to restrict expansion of a depletion layer so as to improve a withstand voltage and performance of stationary loss. Further, a $P^+$-type collector layer 5 is extended parallel to the extended direction of the base layer 3 (buffer layer 4) in the surface layer portion of the buffer layer 4.

Further, a plurality of trenches 6 is formed from the base layer 3 to the drift layer 2. In particular, these trenches 6 have a stripe shape extending in a direction that is perpendicular to the extended direction of the collector layer 5 and parallel to a planar direction of the drift layer 2 (semiconductor layer 1c). In other words, the trenches 6 are formed so that the collector layer 5 locates at a tip end side of the trenches with respect to the extended direction of the trenches 6 (left and right direction in FIG. 1). Each of the trenches 6 is formed to extend from the front surface 2a to the rear surface 2b of the drift layer 2 (semiconductor layer 1c). That is, each of the trenches 6 is formed to reach the insulation film 1b.

Further, a length of each of the trenches 6 in a direction perpendicular to the extended direction of the trench 6 and parallel to the planar direction of the drift layer 2 (semiconductor layer 1c) is defined as a width. The width of one end of the trench 6 adjacent to the collector layer 5 is greater than the width of the other end of the trench 6 opposite to the one end. In the present embodiment, on the front surface 2a of the drift layer 2 (semiconductor layer 1c), the width of a portion of the trench 6 formed in the drift layer 2 is greater than the width of a portion of the trench 6 formed in the base layer 3. The planar shape of the trench 6 has a pot shape defining a bottom at the one end adjacent to the collector layer 5.

Each of the trenches 6 is filled with a gate insulation film 7 and a gate electrode 8. The gate insulation film 7 is formed to cover an inner wall surface of each trench 6 and is made of a thermal oxide film or the like. The gate electrode 8 is formed on the gate insulation film 7, and is made of a poly-silicon or the like.

An $N^+$-type emitter layer 9 is formed on the side portion of the trench 6 in the surface layer portion of the base layer 3. A $P^+$-type body layer 10 is formed in the surface layer portion of the base layer 3 at a position separate from the side portion of the trench 6. The emitter layer 9 and the body layer 10 have sufficiently high concentration than the base layer 3.

Figure 2:
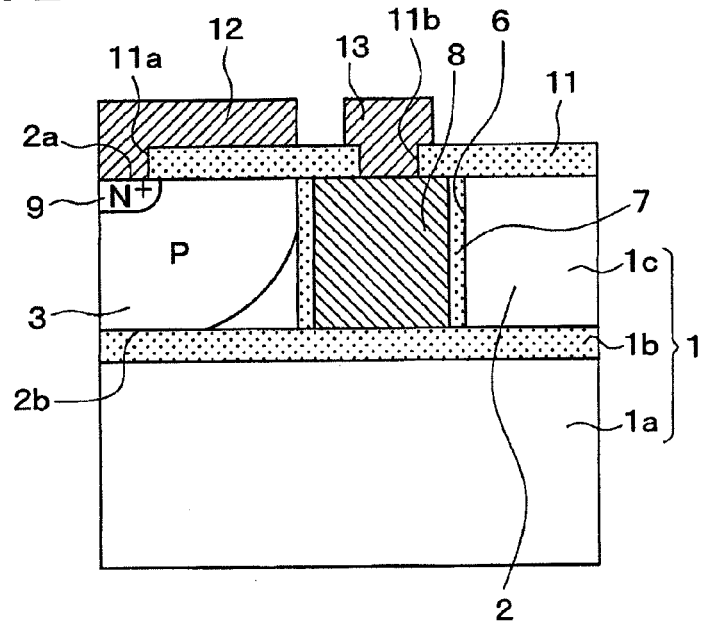
FIG. 2 is a cross-sectional view taken along a line II-II in FIG. 1.
Figure 3:
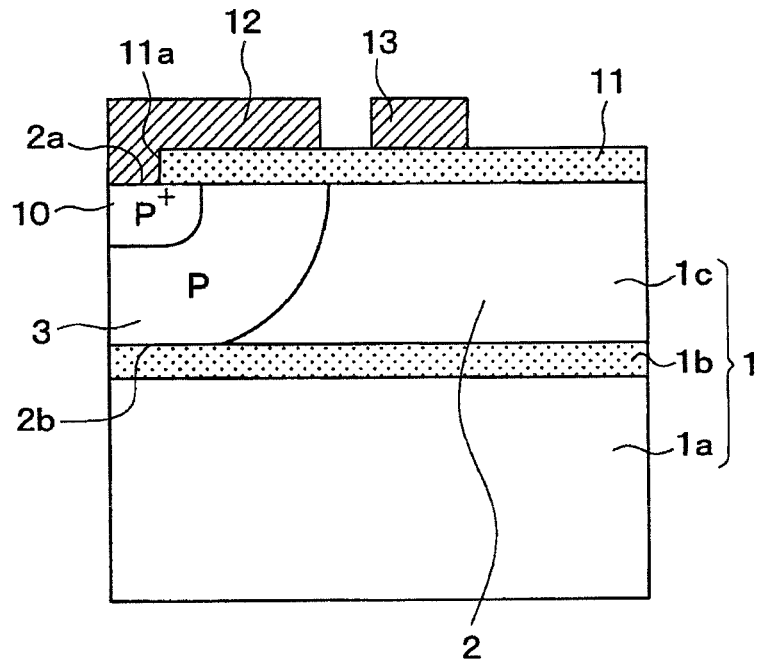
FIG. 3 is a cross-sectional view taken along a line III-Ill in FIG. 1.
Figure 4:
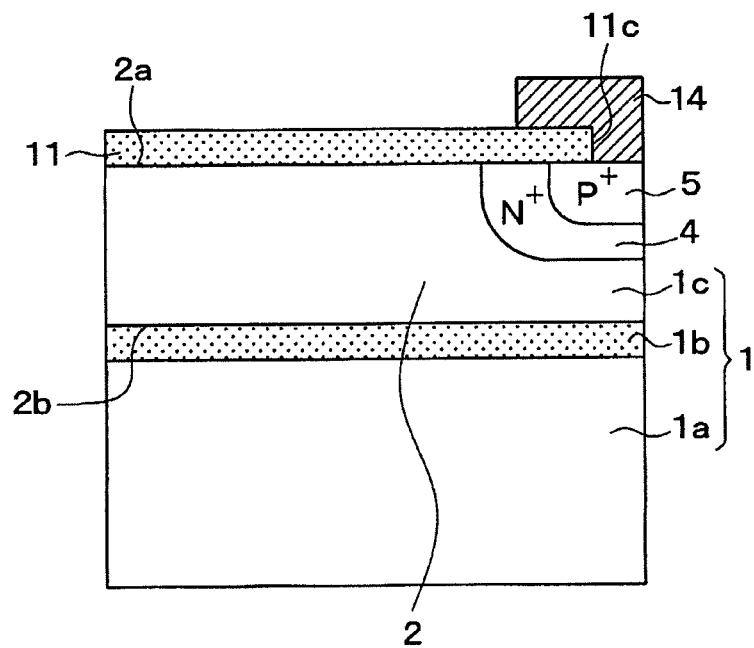
FIG. 4 is a cross-sectional view taken along a line IV-IV in FIG. 1.

As shown in FIGS. 2 to 4, an interlayer insulation film 11 is formed on the front surface 2a of the drift layer 2 (semiconductor layer 1c). This interlayer insulation film 11 is formed with a contact hole 11a (see FIGS. 2 and 3) for exposing a part of the emitter layer 9 and a part of the body layer 10, a contact hole 11b for exposing the gate electrode 8 (see FIG. 2), and a contact hole 11c (see FIG. 4) for exposing the collector layer 5. An emitter electrode 12, a gate wiring 13, and a collector electrode 14 are formed on the interlayer insulation film 11. The emitter electrode 12 is electrically connected to the emitter layer 9 and the body layer 10 through the contact hole 11a. The gate wiring 13 is electrically connected to the gate electrode 8 through the contact hole 11b. The collector electrode 14 is electrically connected to the collector layer 5 though the contact hole 11c.

Figure 5:
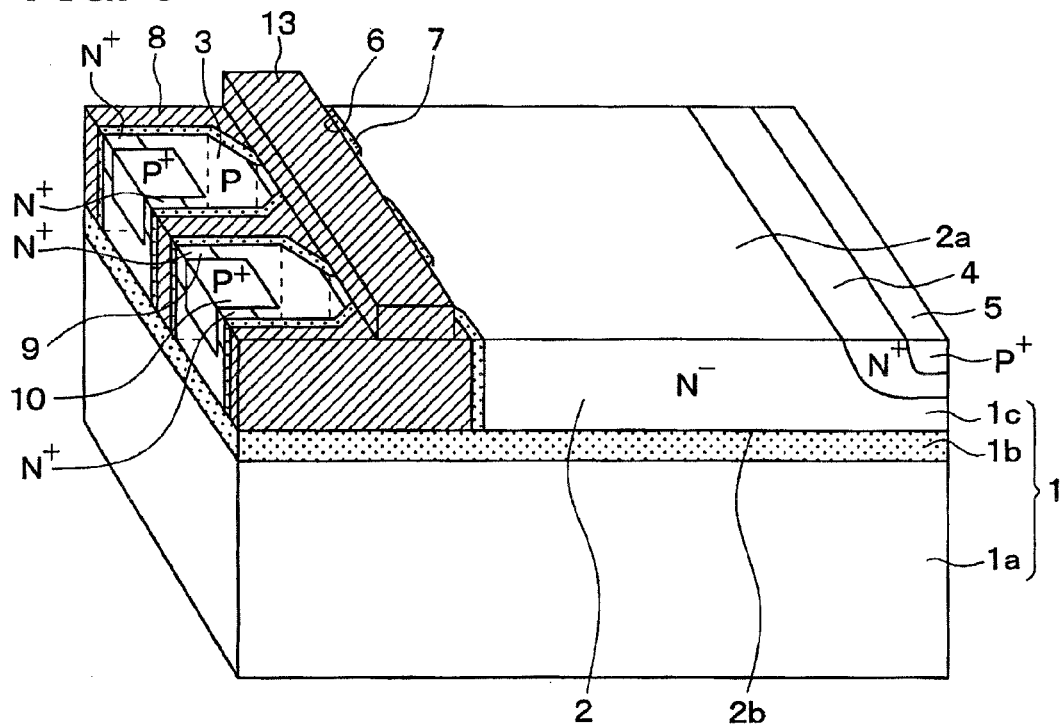
FIG. 5 is a diagram illustrating the semiconductor device, shown in FIG. 1, to which a gate wiring is added

The emitter electrode 12, the gate wiring 13 and the collector electrode 14 are formed by patterning a metal such as Al. As shown in FIGS. 2, 3 and 5, the gate wiring 13 is also formed on the interlayer insulation film 11 that is located between the adjacent trenches 6 to connect a portion of each gate electrode 8 embedded in the one end of each trench 6 adjacent to the collector layer 5. In FIG. 1, the interlayer insulation film 11, the emitter electrode 12, the gate wiring 13 and the collector electrode 14 are not illustrated for the purpose of easing understanding of an arrangement relationship of each component.

The semiconductor device of the present embodiment has the structure described hereinabove. In the present embodiment, the $N^+$-type and the $N^-$-type correspond to a first conductivity-type, and the P-type and the $P^+$-type correspond to a second conductivity-type.

Next, a manufacturing method of the above-described semiconductor device will be described.

First, the above-described semiconductor substrate 1 is prepared. The base layer 3, the buffer layer 4, the collector layer 5, the emitter layer 9 and the body layer 10 are formed in the semiconductor layer 1c by performing ion implantation, thermal diffusion and the like.

Thereafter, an etching mask provided by a silicon oxide film or the like is formed on the semiconductor layer 1c by a chemical vapor deposition technique (hereinafter simply referred to as CVD) or the like. The etching mask is patterned to form openings in regions where the trenches 6 are to be formed. The trenches 6 having the above-described shape are formed by performing anisotropic etching, such as reactive ion etching, using the etching mask.

Thereafter, the gate insulation film 7 is formed on the inner wall surface of the trench 6, and the gate electrode 8 is formed by filling a poly-silicon or the like on the gate insulation film 7.

Next, the poly-silicon and the etching mask accumulated on the semiconductor layer 1c are removed. Thereafter, the interlayer insulation film 11 is made by forming an oxide film, a BPSG film and the like. Further, the contact holes 11a-11c are formed by performing reactive ion etching to the interlayer insulation film 11. Next, a metal film is deposited on the interlayer insulation film 11 to fill each of the contact holes 11a-11c. The emitter electrode 12, the gate wiring 13 and the collector electrode 14 are formed by suitably patterning the metal film. Thus, the above-described semiconductor device is produced.

Figure 6:
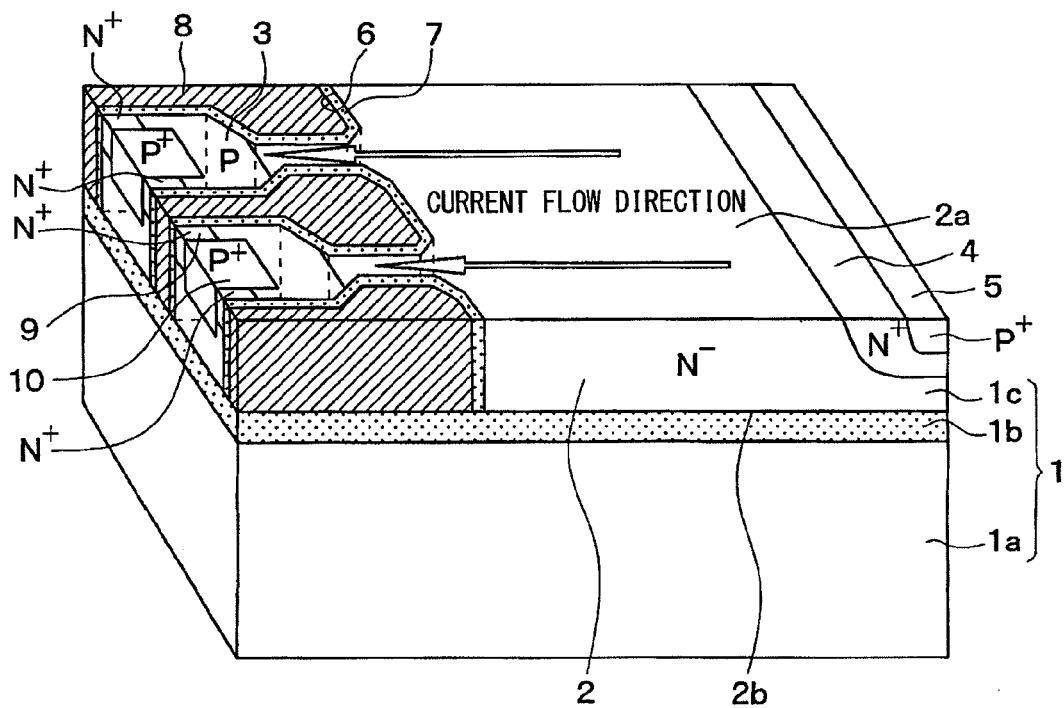
FIG. 6 is a diagram illustrating an on state of the semiconductor device shown in FIG. 1.

Next, an operation of the above-described semiconductor device will be described with reference to FIG. 6.

In the above-described semiconductor device, when a predetermined gate voltage is applied to the gate electrode 8, an N-type channel region is formed at a portion abutting on the trench 6 in the base layer 3. Further, electrons are supplied from the emitter layer 9 to the drift layer 2 through the channel region, and holes are supplied from the collector layer 5 to the drift layer 2. A resistance value of the drift layer 2 reduces due to conductivity modulation, resulting in an on state. Thus, an electric current flows.

In this case, as described above, the trench 6 extends in the direction perpendicular to the extended direction of the collector layer 5. That is, the collector layer 5 is located in an area adjacent to the end of the trench 6 in the extended direction. Therefore, the current flows in the drift layer 2 along the planar direction, and then in the extended direction of the trench 6 along the trench 6. Since the trench 6 is formed to reach the rear surface 2b of the drift layer 2 (semiconductor layer 1c), it is less likely that the flow direction of the current will be changed due to the current flowing down the lower portion of the trench 6.

As described above, in the semiconductor device of the present embodiment, the trench 6 is formed to reach the rear surface 2b of the drift layer 2 (semiconductor layer 1c), and the current flows in the extended direction of the trench 6 along the trench 6. Therefore, it is less likely that the flow direction of the current will be changed due to the current flowing down to the lower portion of the trench 6. Further, it is less likely that a current concentration will occur at the lower portion of the trench 6. Therefore, the increase in on-state resistance and the decrease in breakdown resistance are suppressed.

The trench 6 is formed to reach the rear surface 2b of the drift layer 2 (semiconductor layer 1c). Therefore, even if a high voltage is applied at the time of turning off or the like, an occurrence of a high electrical field at the lower portion 6 is suppressed. As such, the decrease in withstand voltage and the decrease in breakdown resistance are suppressed.

The width of the one end of the trench 6 adjacent to the collector layer 5 is greater than the width of the other end of the trench 6 opposite to the one end. Therefore, the holes supplied to the drift layer 2 is not easily escaped from the emitter electrode 12 through the base layer 3 and the body layer 10, and thus a large amount of holes can be accumulated in the drift layer 2. As such, the total amount of electrons supplied to the drift layer 2 from the emitter layer 9 can be increased, and thus the on-state voltage can be reduced.

The base layer 3 is formed to reach the rear surface 2b of the drift layer 2 (semiconductor layer 1c). Therefore, a large channel region can be formed, as compared with a case where the base layer 3 is formed only in the surface layer portion of the drift layer 2. An occurrence of current concentration when the current flows from the drift layer 2 to the channel region can be suppressed.

Second Embodiment

A second embodiment of the present disclosure will be described. In the present embodiment, the emitter layer 9 is not separated, relative to the first embodiment. The other structures are similar to those of the first embodiment, and thus descriptions thereof will be omitted.

Figure 7:
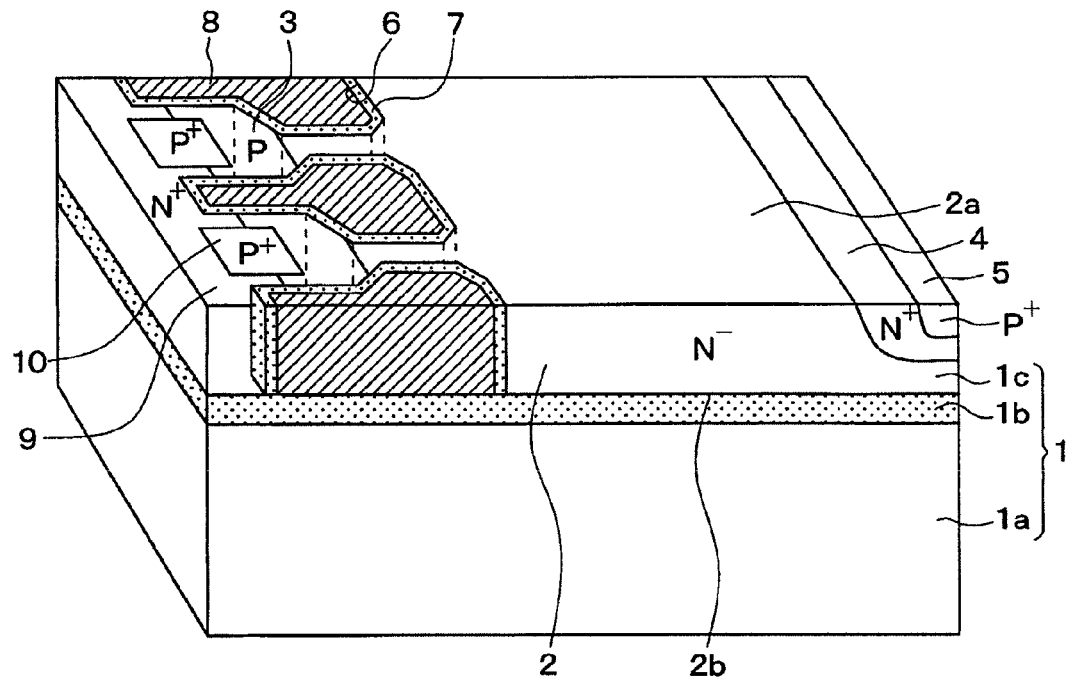
FIG. 7 is a perspective cross-sectional view of a semiconductor device according to a second embodiment of the present disclosure.

As shown in FIG. 7, in the present embodiment, the emitter layer 9 is formed at the side portions of the trenches 6 and to surround the other ends of the trenches 6, which are opposite to the one ends of the trenches 6 adjacent to the collector layer 5, on the surface 2a of the semiconductor layer 1c.

In such a semiconductor device, the area where the emitter electrode 12 contacts the emitter layer 9 increases. Therefore, similar effects to those of the above-described first embodiment can be achieved while reducing a contact resistance between the emitter electrode 12 and the emitter layer 9.

Third Embodiment

A third embodiment of the present disclosure will be described. In the present embodiment, the shape of the trench 6 is modified from that of the first embodiment. The other structures are similar to those of the first embodiment, and thus descriptions thereof will be omitted.

Figure 8:
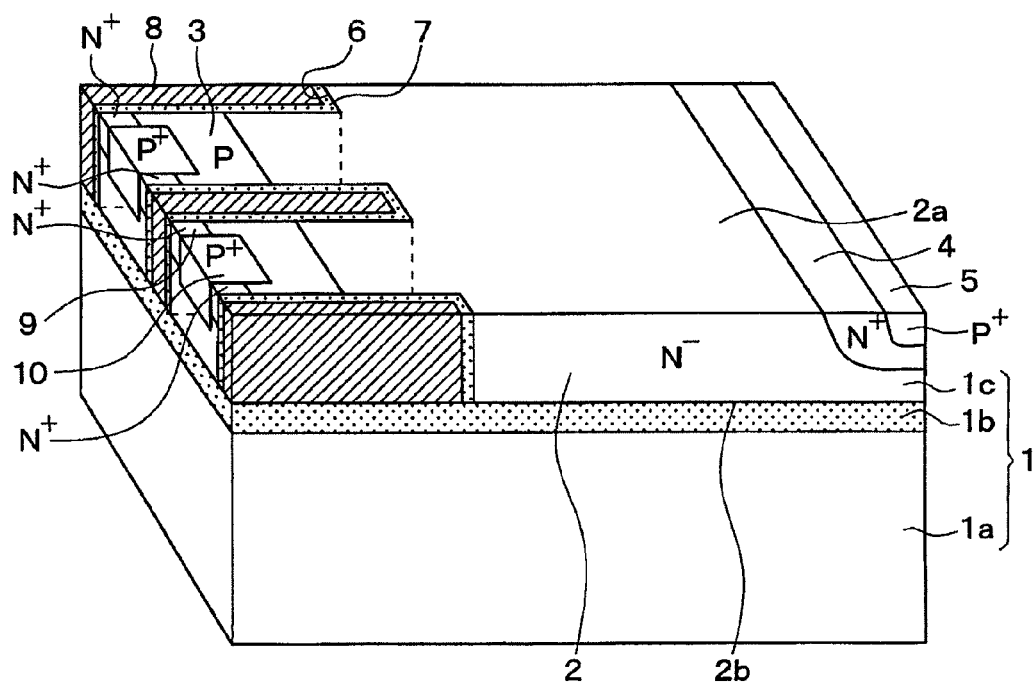
FIG. 8 is a perspective cross-sectional view of a semiconductor device according to a third embodiment of the present disclosure.

As shown in FIG. 8, in the present embodiment, the trench 6 is formed such that the width of the one end adjacent to the collector layer 5 is equal to the width of the other end opposite to the one end. Also in such a semiconductor device, the similar effects to those of the first embodiment can be achieved.

Other Embodiments

In each of the embodiments described above, an example in which the first conductivity-type is the N-type and the second conductivity-type is the P-type is described. However, the first conductivity-type may be the P-type and the second conductivity-type may be the N-type.

In each of the embodiments described above, the description is made in regard to the semiconductor device in which the IGBT having the collector layer 5 is formed. However, the present disclosure can be employed to a semiconductor device in which a MOS without having the collector layer 5 is formed.

In each of the embodiments described above, the base layer 3 may be formed only in the surface layer portion of the drift layer 2. Namely, it is not necessary that the base layer 3 is formed in the drift layer 2 (semiconductor layer 1c) to reach the rear surface 2b from the front surface 2a.

In each of the embodiments described above, the example in which the gate wiring 13 is made of a metal such as Al is described. However, the gate wiring 13 may be made of a poly-silicon, similar to the gate electrode 8. In a case where the gate wiring 13 is made of the poly-silicon as described above, the poly-silicon that is accumulated when being filled in the trench 6 may be used. As compared to the case where the gate wiring 13 is made of the metal such as Al, an occurrence of defect failure due to joining of dissimilar materials can be reduced.

In each of the embodiments described above, the collector layer 5 may be formed separately in the extended direction of the buffer layer 4. That is, the buffer layer 4 is exposed between adjacent collector layers 5, and is also electrically connected to the collector electrode 14. Namely, the present disclosure can be employed to a semiconductor device in which a so-called RC (Reverse-Conducting)-IGBT is formed.

In each of the embodiments described above, it is described the method in which the trench 6 is formed after the base layer 3, the buffer layer 4, the collector layer 5, the emitter layer 9 and the body layer 10 are formed in the semiconductor substrate 1. However, the base layer 3, the buffer layer 4, the collector layer 5, the emitter layer 9 and the body layer 10 may be formed after the trench 6 is formed and then the gate insulation film 7 and the gate electrode 8 are formed in the trench 6. Alternatively, the trench 6 may be formed after a part of the diffusion layer is formed, the gate insulation film 7 and the gate electrode 8 may be then formed in the trench 6. Thereafter, the remaining diffusion layer may be formed.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A semiconductor device comprising:
   a semiconductor layer providing a first conductivity-type drift layer;
   a second conductivity-type base layer disposed at least in a surface layer portion of the drift layer adjacent to a front surface of the drift layer;
   a plurality of trenches extended in a predetermined direction from the base layer to the drift layer;
   a gate insulation film disposed on a wall surface of each of the plurality of trenches;
   a gate electrode disposed on the gate insulation film;
   a first conductivity-type emitter layer disposed in a surface layer portion of the base layer and at side portions of the plurality of trenches;
   a second conductivity-type collector layer disposed in the surface layer portion of the drift layer and separated from the base layer;
   an emitter electrode electrically connected to the emitter layer and the base layer; and
   a collector electrode electrically connected to the collector layer, wherein
   the trenches are disposed to reach a rear surface of the drift layer,
   the collector layer is disposed at a tip end side in an extended direction of the trenches in the surface layer portion of the drift layer, and
   when the gate electrode is applied with a predetermined voltage, a channel region is formed in a portion of the base layer contacting the trenches and an electric current flows in the predetermined direction along the trenches.

2. The semiconductor device according to claim 1, wherein in each of the trenches, a length of an end adjacent to the collector layer is greater than a length of the other end opposite to the end, the length being defined in a direction perpendicular to the predetermined direction.

3. The semiconductor device according to claim 1, wherein the base layer is disposed to reach the rear surface of the drift layer.

4. The semiconductor device according to claim 1, wherein the semiconductor layer is disposed on a support substrate through a separation film for electrically insulating the semiconductor layer from the support substrate, and the trenches are disposed to reach the separation film.

5. The semiconductor device according to claim 1, wherein the emitter layer is disposed on the side portions of the respective trenches in the front surface of the semiconductor layer and surrounds the other ends of the trenches opposite to the ends adjacent to the collector layer.

* * * * *